(12) United States Patent
Giovanola

(10) Patent No.: US 8,236,187 B2
(45) Date of Patent: Aug. 7, 2012

(54) INK-JET PRINTHEAD MANUFACTURING PROCESS

(75) Inventor: Lucia Giovanola, Arnad (IT)

(73) Assignee: Telecom Italia S.p.A., Milan (IT)

( * ) Notice: Subject to any disclaimer, the term of this patent is extended or adjusted under 35 U.S.C. 154(b) by 503 days.

(21) Appl. No.: 12/520,795

(22) PCT Filed: Dec. 22, 2006

(86) PCT No.: PCT/EP2006/012453
§ 371 (c)(1),
(2), (4) Date: Jul. 15, 2009

(87) PCT Pub. No.: WO2008/077419
PCT Pub. Date: Jul. 3, 2008

(65) Prior Publication Data
US 2010/0032408 A1 Feb. 11, 2010

(51) Int. Cl.
*G01D 15/00* (2006.01)
*G11B 5/127* (2006.01)
*B41J 2/14* (2006.01)

(52) U.S. Cl. ....... 216/27; 216/36; 29/890.1; 29/890.142

(58) Field of Classification Search ...................... 216/27
See application file for complete search history.

(56) References Cited

U.S. PATENT DOCUMENTS

| | | | |
|---|---|---|---|
| 4,609,427 A * | 9/1986 | Inamoto et al. | ........... 216/27 |
| 6,303,042 B1 | 10/2001 | Hawkins et al. | |
| 6,673,694 B2 | 1/2004 | Borenstein | |
| 6,863,375 B2 | 3/2005 | Makigaki et al. | |
| 2005/0253897 A1* | 11/2005 | Silverbrook | ........... 347/40 |
| 2006/0028508 A1 | 2/2006 | Chen et al. | |
| 2006/0114294 A1* | 6/2006 | Kim | ........... 347/63 |
| 2006/0158486 A1 | 7/2006 | Bibl et al. | |

FOREIGN PATENT DOCUMENTS

| | | |
|---|---|---|
| FR | 2 860 249 A1 | 4/2005 |
| WO | WO 2005/034218 | 4/2005 |
| WO | WO 2005/037558 | 4/2005 |

OTHER PUBLICATIONS

International Search Report dated Dec. 4, 2007, issued in PCT/EP2006/012453.
H. Moriceau et al., "The Bonding Energy Control: An Original Way to Debonable Substrates," Electrochemical Society Conf. Wafer Bonding Symposium, 2003.

* cited by examiner

*Primary Examiner* — Shamim Ahmed
*Assistant Examiner* — Bradford Gates
(74) *Attorney, Agent, or Firm* — Venable LLP; Robert Kinberg

(57) ABSTRACT

A process for manufacturing an inkjet print head comprising the steps of providing a print head wafer comprising a plurality of print head dice coated with a barrier layer, each print head die comprising a plurality of actuators and interconnections, the barrier layer comprising a plurality of openings in correspondence with the plurality of actuators and interconnections, providing a debondable SOI wafer comprising a handle layer, a buried layer, and a device layer, forming a protective layer on the surface of the device layer, bonding the device layer to the barrier layer, debonding the handle layer from the SOI wafer, etching the device layer so as to realize a plurality of openings in correspondence with the plurality of actuators and interconnections, and removing the protective layer in correspondence of the plurality of openings.

15 Claims, 8 Drawing Sheets

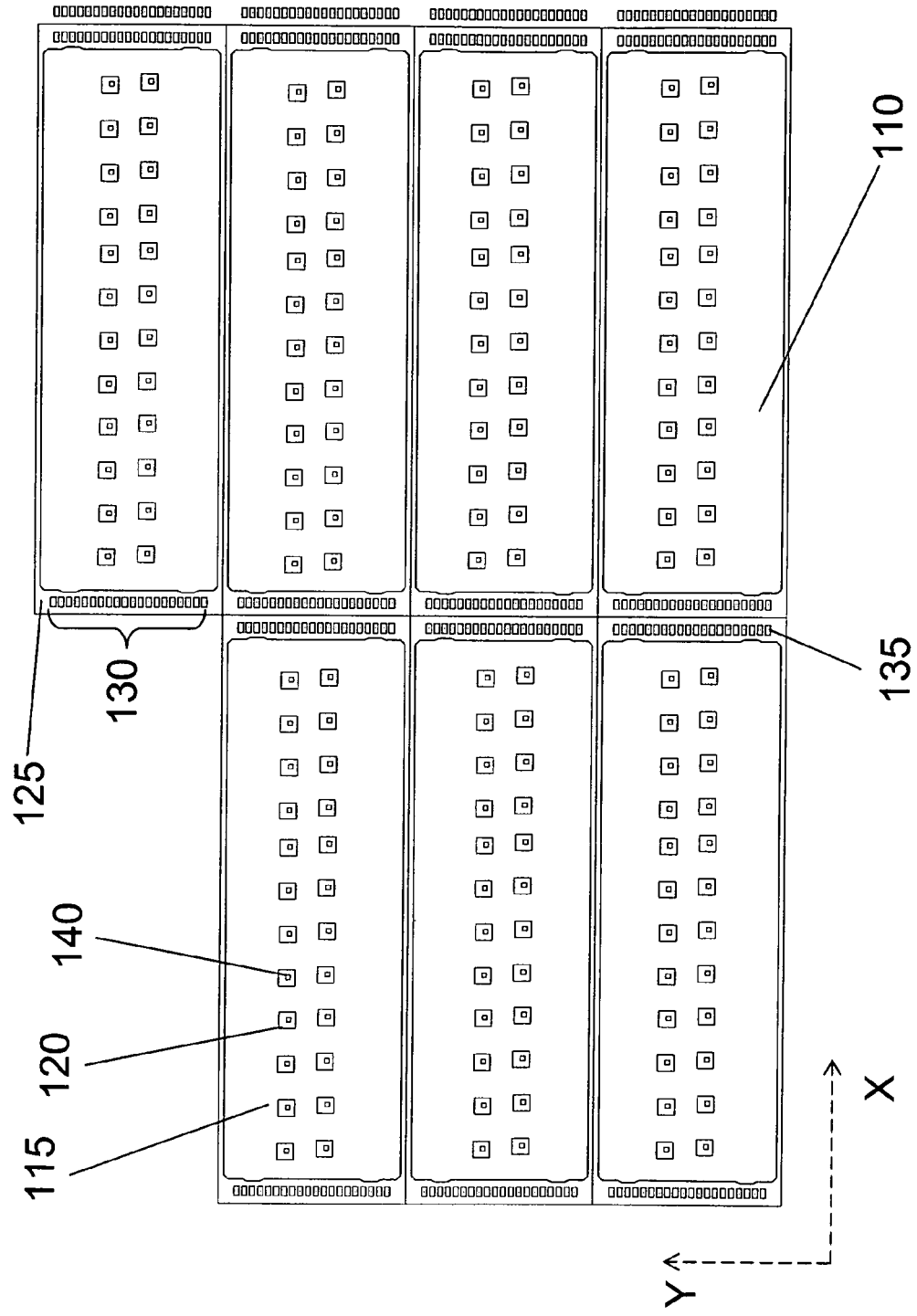

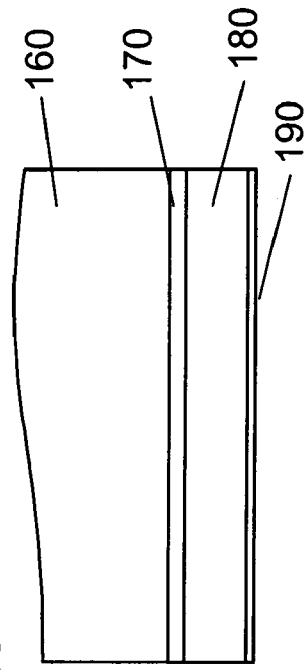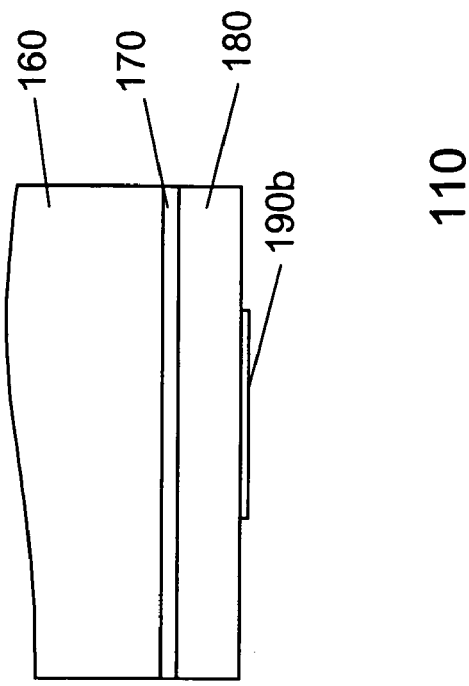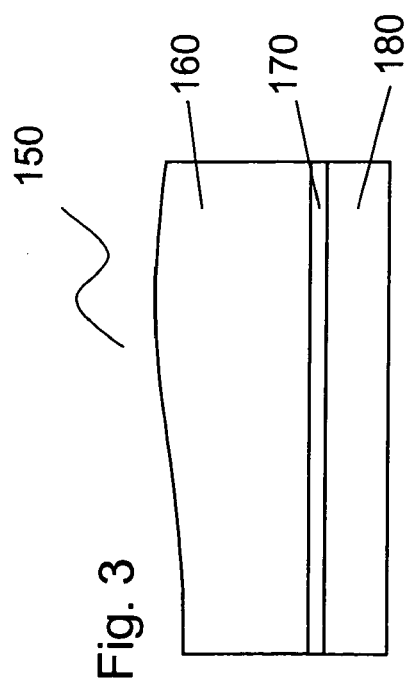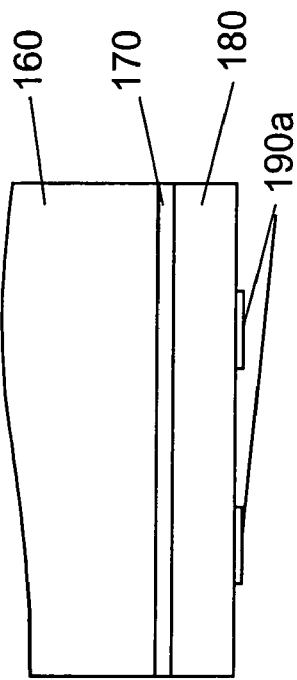

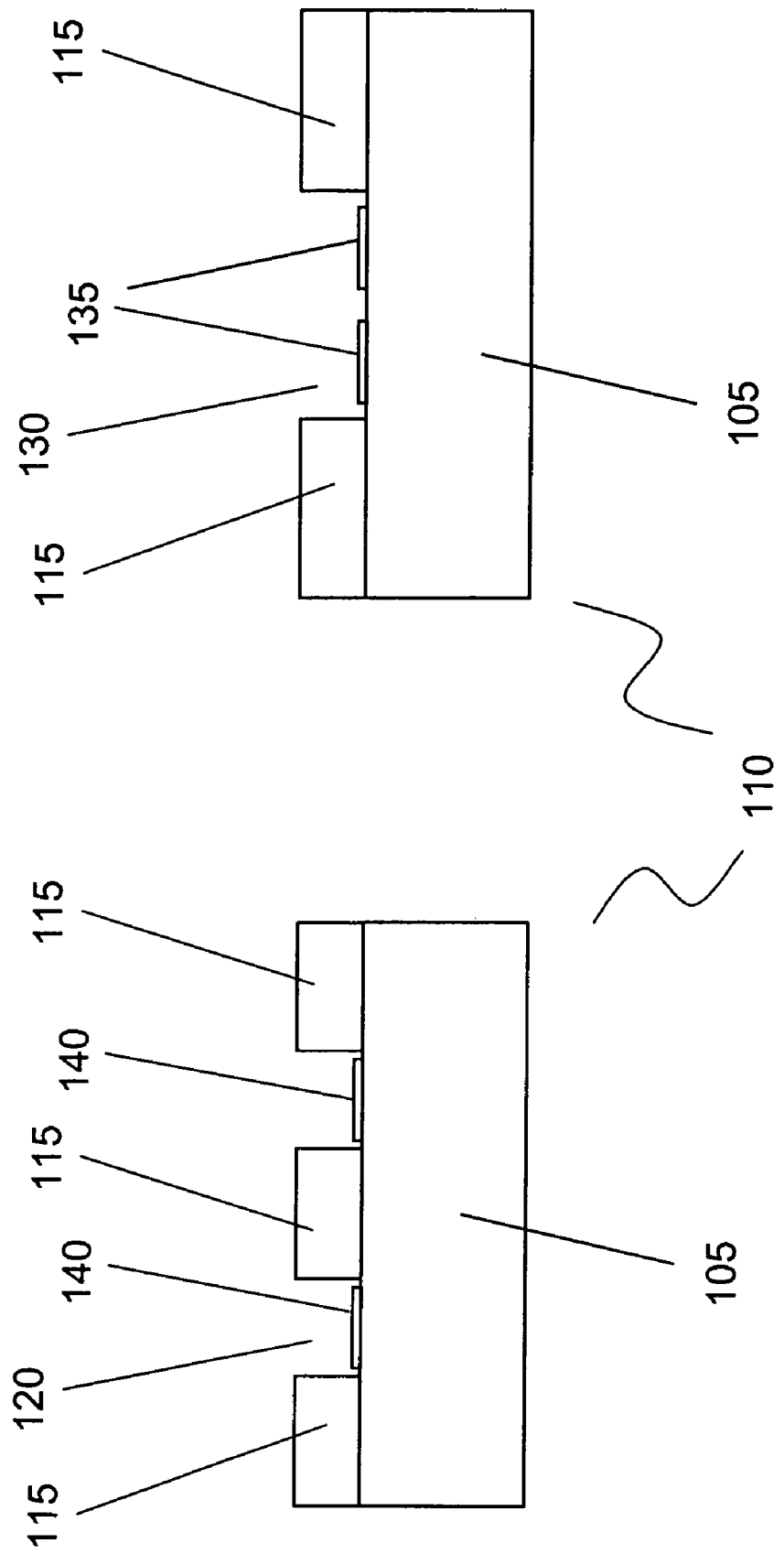

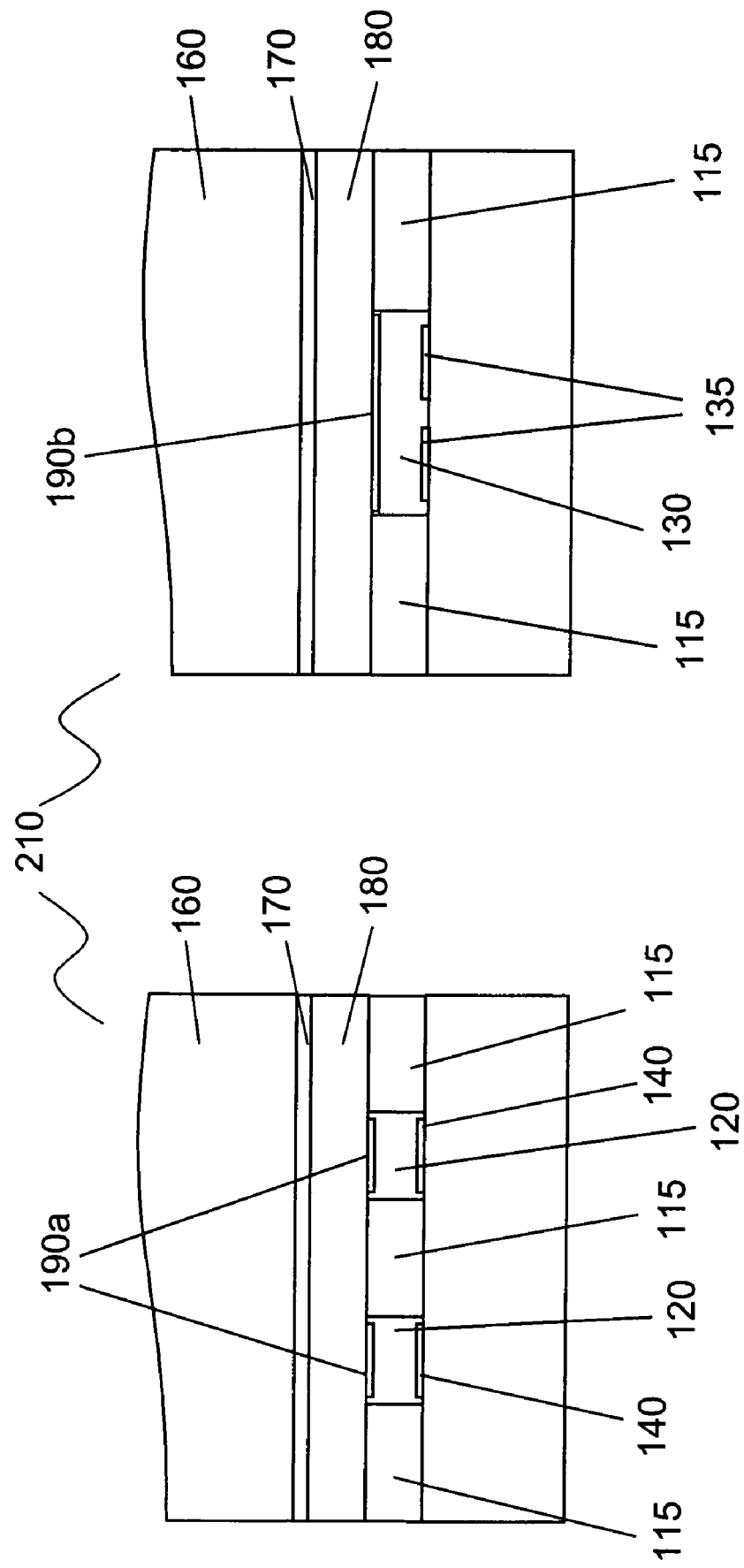

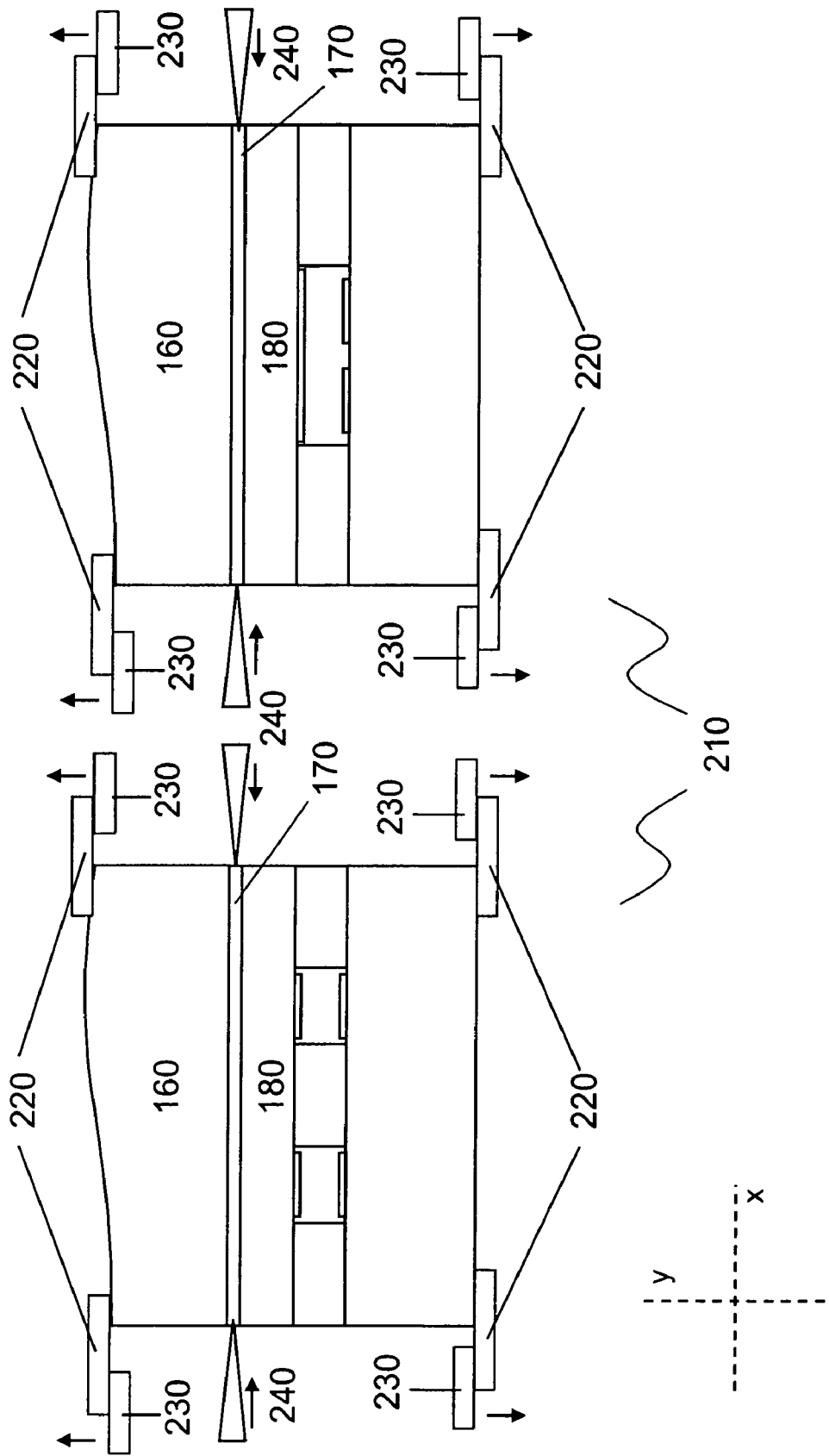

INK-JET PRINTHEAD MANUFACTURING PROCESS

BACKGROUND OF THE INVENTION

1. Field of the Invention

The present invention relates to a process of manufacturing an ink jet print head. More in particular, the present invention relates to process of manufacturing an ink jet print head comprising a silicon nozzle plate.

2. Description of Related Art

The present invention relates to a method of manufacturing an ink jet print head and in particular a print head of the type in which droplets of ink are expelled from a nozzle by rapid heating of a resistive element contained within an ink collecting chamber and disposed next to the nozzle.

The ink collecting chamber and the resistive element are formed within a multi-layer structure manufactured on a silicon substrate using well known methods of manufacturing of semiconductor devices.

In short, various layers are deposited on a face of the silicon substrate to make up the ejection resistors and, possibly, the active electronic components. After that, a barrier layer of photopolymer is coated on the silicon substrate. Using photolithographic techniques, the ejection cells and ink delivery channels are made in the barrier layer photopolymer and a nozzle plate provided with ejection nozzles built in correspondence with the cells is mounted.

The nozzle plate is an essential component of an ink jet print head. Some known methods of forming ink jet nozzle plates use one or more intermediate molds. One of such methods uses an electroforming process. The electroforming process uses a mold (or mandrel) overcoated with a continuous conductive film having non-conductive structures that protrude over the conductive film. A metallic ink jet nozzle plate is formed using such a mold (or mandrel) by electroplating onto the conductive film. Over time, the metallic layer grows in thickness. The ink nozzles are defined by the non-conductive structures. The metal employed for electroforming nozzle plate is usually nickel coated with gold or palladium.

The metallic nozzle plate is usually bonded to photopolymer layer of the ink jet print head by applying a pressure, e.g., of from 1 to 5 bars, at relatively high temperature, typically ranging from 150° to 200° C., for a certain period of time, e.g., from 1 to 2 hours, this process being commonly known as thermo-compression bonding.

However, the Applicant has noticed that the thermal bonding between the metallic nozzle plate and the photopolymer layer coated on the silicon substrate creates mechanical forces, due to the different coefficient of thermal expansion of the materials, which can cause the rupture of the resulting print head either during the thermo-compression bonding or during the subsequent manufacturing process steps. The different thermal expansion of the materials is a significant issue in the prior art, which limits the size of ink jet printheads that can be manufactured. This is because the difference in the coefficient of thermal expansion between, for example, a nickel nozzle plate and a substrate to which the nozzle plate is connected, where this substrate is of silicon, is quite substantial. Consequently, along a distance occupied by, for example, 1000 nozzles, the relative thermal expansion that occurs between the respective parts when heated from the room temperature to the temperature required for bonding the metallic nozzle plate and the photopolymer layer together can cause a dimension mismatch even greater than a whole nozzle length. This would be significantly detrimental for such devices.

Recently, there has been an increasing interest in manufacturing the nozzle plate starting from a silicon substrate.

U.S. Pat. No. 6,863,375 relates to a method of forming a nozzle plate by etching a silicon monocrystalline substrate. The piezoelectric ink jet head is then arranged by bonding together the nozzle plate and the cavity plate, both made of silicon monocrystalline, with the glass substrate. The nozzle plate disclosed in this specification has a thickness of 180 μm.

U.S. Pat. No. 6,303,042 discloses a method for forming an ink jet nozzle plate using a SOI wafer having a top substrate layer, a buried layer, and a bottom substrate layer. The method substantially comprises the steps of (1) providing a composite mask over the top substrate layer having a cavity mask which provides openings and a bore mask having openings which are entirely within the openings of the cavity mask and extend to the top substrate layer, (2) anisotropically etching through the bore mask openings through top substrate layer and the buried layer into a portion of the bottom substrate layer, (3) removing the bore mask and etching the top and bottom substrate layers without substantially affecting the buried layer to extend the openings in the top substrate layer and the bottom substrate layer, (4) removing the cavity mask and attaching the top substrate layer to a base provided with ink delivery channels with correspond to the openings in the buried layer, (5) and removing the bottom substrate layer. The removal of the bottom substrate layer is made by wet or dry etching or, preferably, by mechanical grinding followed by chemical polishing or by plasma etching.

U.S. Pat. No. 6,673,694 discloses a general fabrication method for producing MicroElectroMechanical Systems (MEMS) and related devices using Silicon-On-Insulator (SOI) wafers. A SOI wafer has (i) a handle layer, (ii) a dielectric layer, and (iii) a device layer. The SOI wafer is patterned and etched in the device and dielectric layers and then bonded to a substrate of glass, silicon, or other material. Then the handle layer of the SOI wafer is removed by wet or dry etching, followed by the removal of the dielectric layer of the SOI wafer.

Recently, the use of debondable SOI wafers has been theorized for applications where a thin layer needs to be applied to a substrate such as, for example, in the field of microelectromechanical systems. In debondable SOI wafers, comprising (i) a handle layer, (ii) a debonding layer, and (iii) a device layer, the handle layer is removed from the device layer by mechanical debonding action (H. Moriceau, O. Rayssac, B. Aspar, B Ghyselen, "The Bonding Energy Control: An Original Way To Debondable Substrates", Presented at Electro-Chemical Society Conf. Paris May 2003—Wafer-Bonding Symposium (said article have been downloaded on Oct. 31, 2006 from the website of Tracit Technologies, a French company having its headquarters in Moirans, France, at http://www.tracit-tech.com/Publi/Publi_2.pdf). Debondable SOI wafers and method of manufacturing thereof have been also disclosed, for example, in International Patent Application WO2005/034218.

The Applicant has noticed that the current tendency to the reduction of the volume of the drop ejected by the nozzle plate, now in the order of a few picoliters, is not compatible with a nozzle plate having a thickness higher than 100 μm, and even less higher than 150 μm. Rather, the thickness of the current nozzle plates for thermal ink jet print head is in the range of from 20 to 100 μm. Silicon wafers having such a thickness are expensive and are not usually commercialized.

Further, silicon wafers having a thickness of from 20 to 100 µm would be very difficulty handled and worked.

On the other hand, the Applicant has noticed that the removal of the handle or bottom layer of a conventional SOI wafer by etching or mechanical grinding, though possible, has many drawbacks. First, the process of removing several hundreds of micrometers of silicon is a long and expensive operation. Second, there could be some incompatibilities between the removal process and the printhead. Third, the mechanical grinding removal can cause damages to other components of the printhead.

Finally, the Applicant has found that when a method employing a debondable SOI wafer is applied to the manufacturing of ink-jet print head, wherein the silicon nozzle plate to be attached to a barrier layer could be obtained from the device layer, the following additional problems arise. If the device layer of the SOI wafer is etched to create the nozzles after the bonding of the SOI wafer to the substrate, the actuators can be damaged during the etching process. On the other hand, if the device layer of the SOI wafer is etched to create the nozzles before bonding the SOI wafer to the barrier layer, the structure of the SOI wafer is weakened and the device layer can be damaged during the step of debonding of the handle layer.

Accordingly, there is still the need to an improved method for overcoming the above mentioned problems.

The Applicant has found that the aforementioned problems can be avoided by using a process for manufacturing an ink-jet print head comprising the steps of a) providing a print head wafer comprising a plurality of print head dice coated with a barrier layer, each print head die comprising a plurality of actuators and interconnections, said barrier layer comprising a plurality of openings in correspondence with said plurality of actuators and interconnections, b) providing a debondable SOI wafer comprising a handle layer, a buried layer, and a device layer, c) forming a protective layer on the surface of said device layer, d) bonding said device layer to said barrier layer, e) debonding said handle layer from said SOI wafer, f) etching said device layer so as to realize a plurality of openings in correspondence with said plurality of actuators and interconnections, and g) removing said protective layer in correspondence of said plurality of openings.

The Applicant has found that the process of the present invention allows to realize inkjet print head comprising silicon nozzle plate having a thickness lower than 100 µm without using expensive thin silicon layers and complex handling and manufacturing operations.

Moreover, the Applicant has found that the process of the present invention allows to easily remove the handle layer without causing damages to the printhead.

Finally, the Applicant has found that the process of the present invention allows to avoid damages to the actuators of the inkjet printhead without weakening the structure of the SOI wafer.

DESCRIPTION OF THE DRAWINGS

FIG. 2 represents an enlargement of a portion of FIG. 1.

FIG. 3 represents a schematic section view of a portion of debondable SOI wafer.

FIGS. 3a to 3c represent schematic section views of a portion of debondable SOI wafer during the intermediate step c) of the process of the present invention.

FIGS. 4a and 4b represent schematic section views of a portion of the printhead wafer in correspondence with the resistor zone and pad-like contacts, respectively.

FIGS. 5a and 5b represent schematic section views of a portion of the printhead wafer and debondable SOI wafer in correspondence with the connecting pad zone at the end of the bonding step d) of the process of the present invention.

FIGS. 6a and 6b represent schematic section views of a portion of the printhead wafer and debondable SOI wafer during debonding step e) of the process of the present invention.

DETAILED DESCRIPTION OF THE INVENTION

Figure 1:
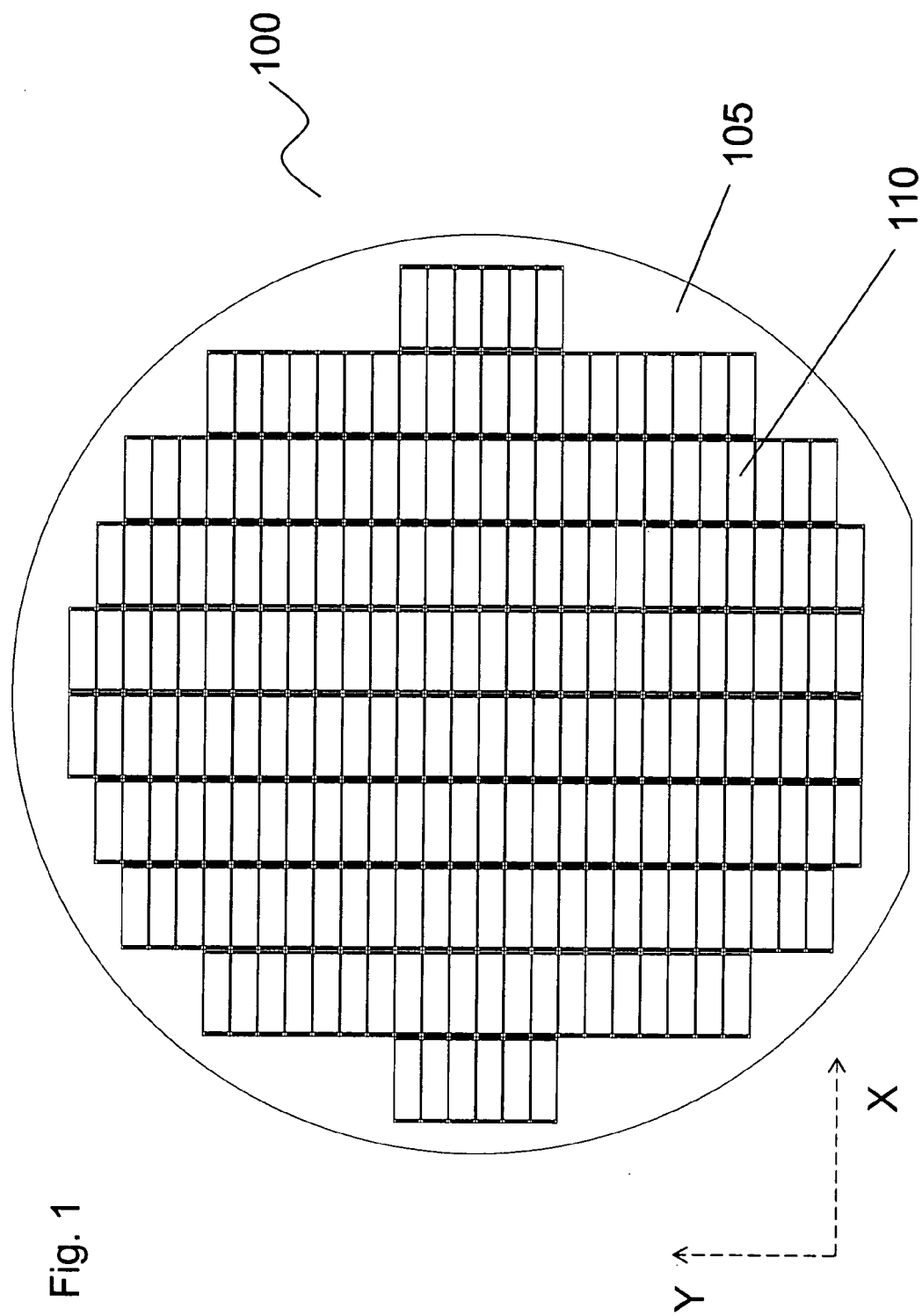
FIG. 1 represents a top view of a printhead wafer

FIG. 1 is a top view the print head wafer 100 provided in step a) of the process of the present invention. The print head wafer 100 comprises a substrate 105, preferably a silicon substrate, generally having a diameter of about 6 inches, and a typical thickness of about 600-700 µm, more in particular of about 675 µm. The print head wafer 100 comprises a plurality of print head dice 110 having a substantially rectangular shape. On the upper surface of each dice various layers are deposited using known technologies to form the actuators, typically represented by resistors, the interconnections, typically represented by pad-like contacts, to which external circuits are connected by wire bonding, and the metallic conductive traces and the active electronic components, such as, for example, the MOS transistors driving the actuators.

With reference to FIG. 2, in correspondence of each print head die 110, on the upper surface 125 of the substrate 105, a plurality of individually-energizable thin-film resistors 140 which function as "ink ejectors", is realized using standard thin film fabrication techniques known in the art. The thin-film resistors are preferably fabricated from a tantalum-aluminum composition known in the art for resistor construction. Also provided on the upper surface 125 of the substrate 105 using conventional photolithographic techniques is a plurality of metallic conductive traces (not shown) which electrically communicate with the resistors 140. The conductive traces also communicate with multiple metallic pad-like contacts 135 disposed in regions 130 positioned along the short sides of each print head die 110.

Each print head die 110 is covered by a barrier layer 115 provided with openings to leave uncovered the plurality of individually-energizable thin-film resistors 140 (i.e., the actuators) and the multiple metallic pad-like contacts 135 (i.e., the interconnections). Such openings in turns define the ink expulsion/vaporization chambers 120 and the regions 130. The barrier layer 115 is applied on the upper surface 125 of the substrate 105 using standard deposition techniques or other methods known in the art for this purpose including but not limited to standard lamination, spin coating, roll coating, extrusion coating, curtain coating, and micromolding processes. After that, the barrier layer 115 is subjected to standard photolithographic techniques to define ink expulsion/vaporization chambers 120 in correspondence of each ink ejector 140 and regions 130 in correspondence of the multiple metallic pad-like contacts 135.

In FIG. 4a is represented a schematic section view of a print head die 110 in correspondence with the resistor zone, wherein the barrier layer 115 defines the ink expulsion/vaporization chambers 120 surrounding the ink ejectors 140 made on the silicon substrate 105.

In FIG. 4b is represented a schematic section view of a print head die 110 in correspondence with the pad-like contacts zone, wherein the barrier layer 115 defines the region 130 surrounding the pad-like contacts 135 made on the silicon substrate 105.

The barrier layer 115 also works as a chemical and electrical insulating layer relative to the various components on the upper surface 125 of the substrate 105. Representative compounds suitable for fabricating the barrier layer 115 include but are not limited to: (1) epoxy polymers; (2) acrylic and melamine copolymers, (3) epoxy-acrylate copolymers, and (4) polyimides. However, unless otherwise indicated herein, the claimed invention shall not be restricted to any particular compounds in connection with the barrier layer 115 although materials which are generally classified as photoresists or solder-masks are preferred for this purpose. Likewise, in a non-limiting and representative embodiment, the barrier layer 115 will have a thickness of from about 5 to about 50 μm, preferably from 10 to 40 μm although this value may be varied as needed.

Having reference to FIG. 3, the debondable SOI (silicon-on-insulator) wafer 150 provided in step b) of the process of the present invention is a composite structure typically comprising a handle layer 160, a buried layer 170 and a device layer 180. Debondable SOI wafers generally have a diameter of about 6 inches. Debondable SOI wafers are known in the art and are commercially available for the manufacture of semiconductor device from several manufacturers (such as, for example, Soitec, France, TRACIT Technologies, France). The separation of the handle layer 160 from the device layer 180 (both essentially made of silicon) arises at the interface Si—$SiO_2$ of the buried layer 170, typically consisting of silicon oxide, with the surface of the handle layer 160 or the device layer 180. The separation can also arise within the buried layer 170 at the interface $SiO_2$—$SiO_2$. The separation is typically made by mechanical action. At one edge of the joined structure external separation forces may be exerted on the structures to further facilitate unbending. For example, tension or bending forces, or shear forces, may be exerted on the structures by inserting a blade at the interface between the structures. The bonding energy of the debondable SOI wafer 150 should be as low as possible in order to provide a complete and easy detachment of the handle layer 160 from the device layer 180. The bonding energy should be lower than 2,000 $mJ/m^2$, preferably lower than 1,500 $mJ/m^2$, more preferably lower than 1,000 $mJ/m^2$. The debondable SOI wafer 150 useful in the process of the present invention has a total thickness of from 400 to 1000 μm, preferably from 600 to 800 μm, and more preferably of about 700 μm. The handle layer 160 has a thickness of from 300 μm to 900 μm, preferably from 500 μm to 700 μm. The buried layer 170 has a thickness of from 0.5 μm to 20.0 μm, preferably from 1.0 μm to 10.0 μm, more preferably from 1.0 μm to 5.0 μm. The device layer 180 has a thickness of from 10 μm to 100 μm, preferably from 30 μm to 80 μm.

Having reference to FIG. 3a, a protective layer 190 is realized on the surface of the device layer 180 during step c) of the process of the present invention. The protective layer 190 is typically made by a material which is able to work as an etch-stop layer during the subsequent step f) of silicon dry etching to form the nozzles 200, as it will be explained hereinafter. Preferably, the protective layer 190 is made by inorganic materials, such as, for example, silicon oxide, silicon carbide or silicon nitride. The protective layer 190 is made by any useful technique able to provide a layer of the above mentioned materials on the whole surface of the device layer. Useful techniques are, for example, vacuum deposition, vapor deposition, and the like. Plasma Enhanced Chemical Vapor Deposition (PECVD), Atmospheric Pressure Chemical Vapor Deposition (APCVD), and Low Pressure Chemical Vapor Deposition (LPCVD) are the preferred techniques for depositing inorganic materials constituting the protective layer 190. The thickness of the protective layer 190 is selected by taking in consideration that an excessive increase of thickness can promote mechanical stress in the semi-finished materials, induce adhesion problems between the device layer 180 and the barrier layer 115, and longer processing times for the subsequent patterning and/or removing, while an excessive reduction of thickness can jeopardize the protective action of the protective layer 190. The thickness of the protective layer 190 is preferably in the range of from 50 to 5,000 nm, more preferably from 100 to 1,000 nm.

In the process of the present invention, the protective layer 190 is made to act as a shield for the resistors 140 and the pad-like contacts 135 from the action of the subsequent etching step f) of the present invention which removes the portions of silicon overlooking the resistors 140 within the vaporization chambers 120 (thus opening the nozzles) and the pad-like contacts 135 within the region 130 (thus opening the scribe lines) and, at the same time, to act as an etch-stop for the removal of silicon during the same etching step f) of the present invention.

The protective layer 190 can be continuous as illustrated in FIG. 3a or can be patterned, as illustrated in FIGS. 3b and 3c, to leave the protective layer 190 only in that portions 190a, 190b of the device layer 180 which shall overlook the vaporization chambers 120 and the regions 130, respectively, after the bonding step d) of the present invention. In the latter case, after step c) of the process, the protective layer 190 is subjected to a photolithographic treatment through a mask according to techniques known in the art. For example, a photoresist layer (not shown) is deposited onto the surface of the protective layer 190, preferably by spin coating, exposed using a radiation source with wavelength(s) in the visible spectrum through a mask, and placed in a developer solution. The photoresist layer is patterned so as to cover the areas 190a, 190b of the protective layer 190 that need to be maintained, i.e., those areas overlooking the actuators and the interconnections. Later on, the protective layer 190 can be dry or wet etched with standard known process depending on the material chosen. For example, a silicon oxide protective layer 190 can be wet etched with ammonium fluoride. Wet etching of silicon nitride can be accomplished by a mixture of $H_3PO_4$ and $H_2O$ heated to 150°-180° C. Finally the photoresist is removed leaving the etched structures of the protective layer 190a, 190b where wished.

After that, during bonding step d) of the process of the present invention, the device layer 180 provided with the protective layer 190 (or protective layer pattern 190a,190b) is bonded to the surface of the barrier layer 115 of the print head wafer 100 as illustrated in FIGS. 5a and 5b. The bonding is made by any useful technique able to securely bond the surface of the device layer 190 to the surface of the barrier layer 115. Useful techniques are, for example, thermocompression bonding processes, which comprise the application of a pressure at relatively high temperature. Preferably, the thermocompression bonding process is made by applying a pressure of from 1 to 20 bar, preferably from 3 to 10 bar, at working temperatures of from 100° to 350° C., preferably from 150° to 250° C., and for working times of from 30 to 150 minutes, preferably from 40 to 120 minutes. The bonding process can be carried out in normal atmosphere or in vacuum environment, this latter being preferred to increase the surface adhesion between the surface of the device layer 180 and the surface of the barrier layer 115. At the end of this bonding step d), the debondable SOI wafer 150 and the print head wafer 100 are securely bonded together, to form the composite structure 210, through the bond created between the surface of the device layer 180 provided with the protective layer 190, and the surface of the barrier layer 115.

Figure 7A:
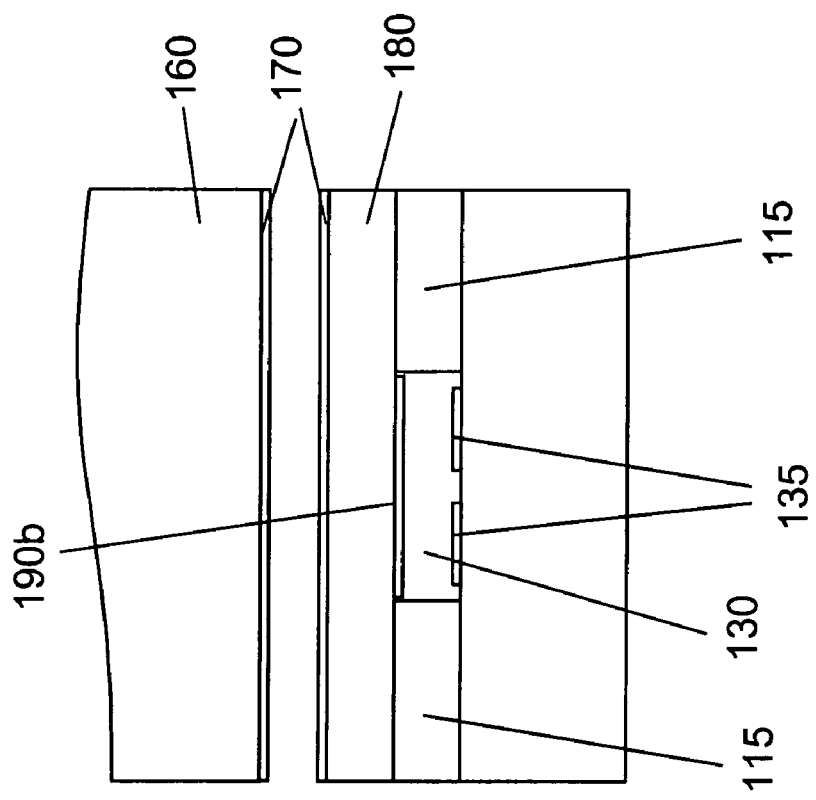
FIGS. 7a and 7b represent schematic section views of a portion of the printhead wafer and debondable SOI wafer at the end of the debonding step e) of the process of the present invention.
Figure 7B:
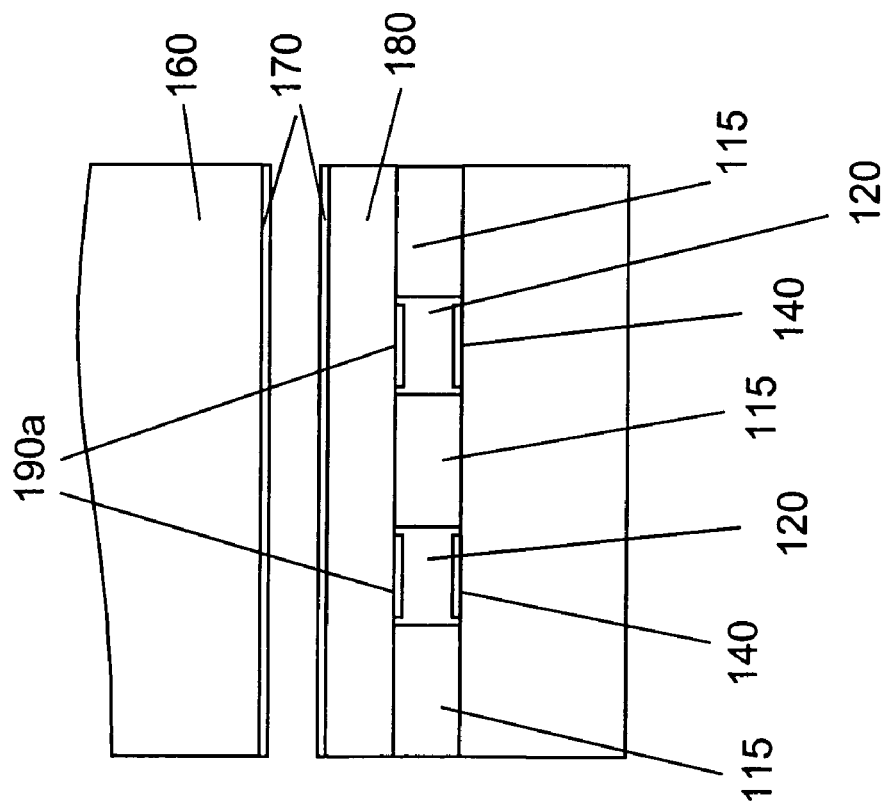

The subsequent debonding step e) of the process of the present invention comprises the debonding of the handle layer 160 from the debondable SOI wafer 150, leaving adhered to the print head wafer 100 the thinner device layer 180 covered by the residual portion of the buried layer 170 consisting of silicon oxide, as illustrated in FIGS. 7a and 7b. The debonding process is performed by techniques known in the art, such as, for example, by mechanical opening using a single-blade or a multi-blade system as described in "The Bonding Energy Control: An Original Way To Debondable Substrates", H Moriceau, O. Rayssac, B. Aspar, B. Ghyselen, presented at ElectroChemical Society Conference, held in Paris on May 2003—Wafer-Bonding Symposium (said article have been downloaded on Oct. 31, 2006 from the website of Tracit Technologies, a French company having its headquarters in Moirans, France, at http://www.tracit-tech.com/Publi/Publi_2.pdf). More in particular, as schematically illustrated in FIGS. 6a and 6b, the mechanical debonding preferably comprises the use an adhesive tape 220 or mounting wax (not shown) to bond the composite structure 210 formed by the debondable SOI wafer 150 and the print head wafer 100 to a supporting frame 230 which exerts a tension force, illustrated by the arrow along the y direction in FIGS. 6a and 6b, to such a composite structure 210. At one or more edge of the composite structure, in correspondence to the buried layer 170, external separation forces, illustrated by the arrows along the x direction in FIGS. 6a and 6b, may be exerted on the composite structure to further facilitate debonding. For example, tension or shear forces may be exerted on the structures by inserting one or multiple blades 240 at the interfaces of the buried layer 170 with the device layer 180 or with the handle layer 160. The adhesive tape 220 can be easily removed by UV exposure. The mounting wax can be easily removed with a solution of alcohol or borax. The bonding energy of the debondable SOI wafer 150 should be as low as possible in order to provide a complete and easy detachment of the handle layer 160 from the device layer 180. The bonding energy should be lower than 2,000 $mJ/m^2$, preferably lower than 1,500 $mJ/m^2$, more preferably lower than 1,000 $mJ/m^2$. FIGS. 7a and 7b show that at the end of the debonding process the handle layer 160 has been completely separated by the device layer 180 which remained securely bonded to the barrier layer 115 of the printhead wafer 100. The removal of the residual silicon oxide of the buried layer 170 from the surface of the device layer 180 is performed by standard dry or wet etching methods known in the art, such as, for example, wet etching with ammonium fluoride. The removal can be performed immediately after this debonding step e), before the etching step f), or during the subsequent step g) together with the removal of the protective layer 190.

Figure 8A:
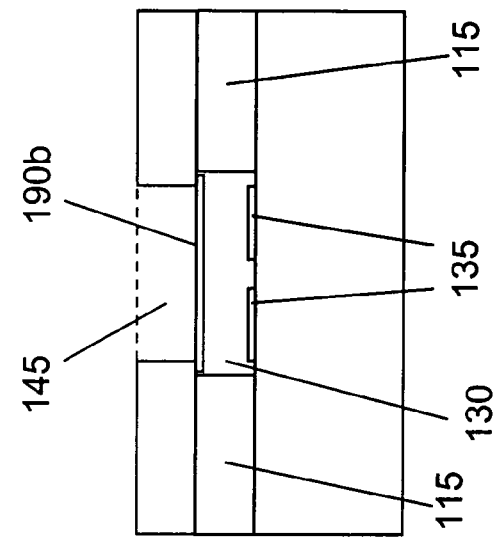
FIGS. 8a and 8c represent schematic section views of a portion of the printhead wafer and debondable SOI wafer after the etching step f) of the process of the present invention.
Figure 8B:
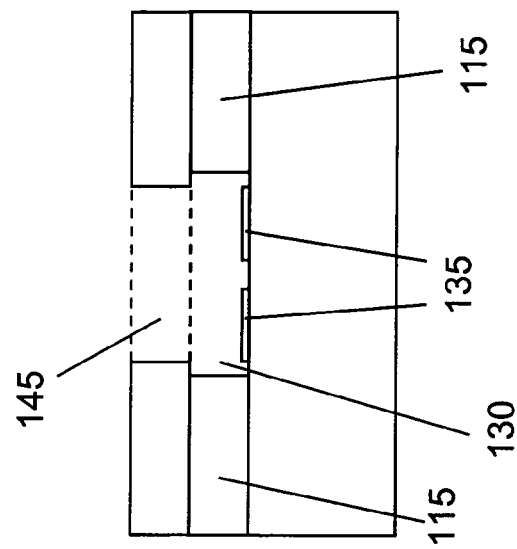

The device layer 180 is then subjected to the etching step f) of the process of the present invention. The etching step f) comprises a photolithographic process through a mask according to techniques known in the art in order to realize and open the nozzles 200 in correspondence with the resistors 140 and the scribe line 145 in correspondence with the pad-like contacts 135, as illustrated in FIGS. 8a and 8b.

For example, a photoresist layer (not shown) is deposited onto the device layer 180, preferably by spray or spin coating, exposed using a radiation source with wavelength(s) in the visible spectrum through a mask, and placed in a developer solution. The photoresist layer is patterned so as to uncover the areas of the device layer 180 that need to be removed, i.e., those areas overlooking the resistors 140 and the pad-like contacts 135. After deposition and patterning of the photoresist layer, the device layer 180 is dry etched, for example, by plasma discharge using carbon fluoride or sulfur hexafluoride, to realize and open the nozzles 200 and the scribe line 145.

Figure 9A:
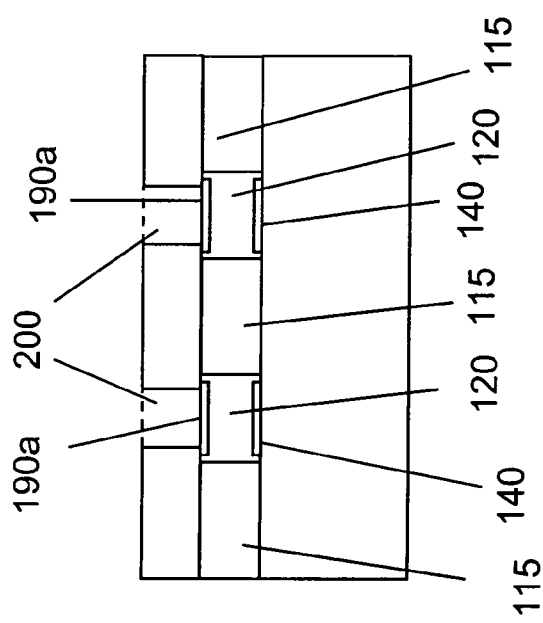
FIGS. 9a and 9b represent schematic section views of a portion of the printhead wafer and debondable SOI wafer after the removing step g) of the process of the present invention.
Figure 9B:
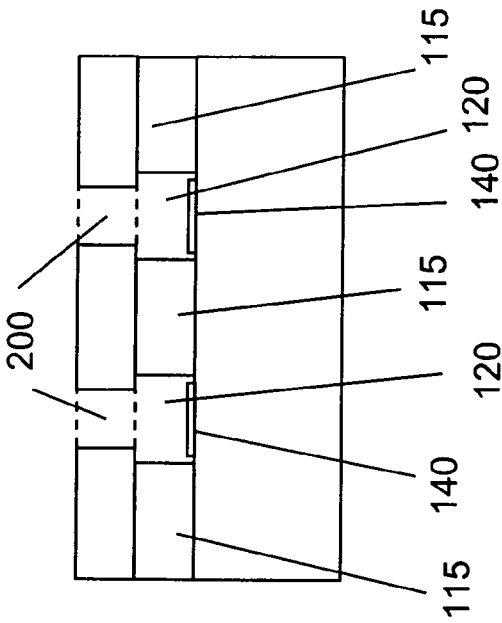

Finally, the protective layer pattern 190a and 190b in correspondence with the nozzles 200 and the scribe line 145 is removed during the removal step f) by wet chemical etching or by dry plasma etching according to techniques known in the art, such as, for example, by wet chemical etching with a hydrofluoric acid aqueous solution. As illustrated in FIGS. 9a and 9b, the removal of the protective layers 190a and 190b finally opens and connects the nozzles 200 with the vaporization chambers 120 and the scribe line 145 with the region 130.

The resulting printhead wafer 100 is then subjected to standard manufacturing operation for the separation of the print head dice 110 by a dicing saw. The individual printheads may be mounted on a properly molded plastic package former incorporating ink channels which supply the appropriate ink to the printhead. The electrical control circuitry and power supply can then be bonded to the pad-like contacts 135 of the printhead with a TAB film or wire bonds. The printhead may be used in a carriage type printer or a plurality of such printheads may be placed on a full width array bar to form a fixed page width printhead.

PART LIST 100 print head wafer
105 substrate
110 print head dice
115 barrier layer
120 ink expulsion/vaporization chambers
125 upper surface
130 regions
135 pad-like contacts
140 energizable thin-film resistors
145 scribe line
150 debondable SOI wafer
160 handle layer
170 buried layer
180 device layer
190 protective layer
200 nozzles
210 composite structure
220 adhesive tape
230 supporting frame
240 blades

The invention claimed is:
1. A process for manufacturing an ink-jet print head comprising the steps of:
  a) providing a print head wafer comprising a plurality of print head dice provided with a barrier layer, each print head die comprising a plurality of actuators and interconnections, said barrier layer comprising a plurality of first openings above with said plurality of actuators and interconnections, b) providing a debondable SOI wafer comprising a handle layer, a buried layer, and a device layer, c) forming a protective layer on the surface of said device layer, d) bonding said device layer to said barrier layer, e) debonding said handle layer from said SOI wafer, f) etching said device layer so as to form a plurality of second openings above said plurality of actuators and interconnections, and g) removing said protective layer below said plurality of second openings.

2. The process for manufacturing an ink-jet print head according to claim 1 wherein said debondable SOI wafer has a total thickness of from 400 to 1000 µm.

3. The process for manufacturing an ink-jet print head according to claim 1 wherein said handle layer has a thickness of from 300 µm to 900 µm.

4. The process for manufacturing an ink-jet print head according to claim 1 wherein said buried layer has a thickness of from 0.5 µm to 20.0 µm.

5. The process for manufacturing an ink-jet print head according to claim 1 wherein said device layer has a thickness of from 10 µm to 100 µm.

6. The process for manufacturing an ink-jet print head according to claim 1 wherein said debondable SOI wafer has a bonding energy lower than 2,000 mJ/m$^2$.

7. The process for manufacturing an ink-jet print head according to claim 1 wherein said debondable SOI wafer has a bonding energy lower than 1,500 mJ/m$^2$.

8. The process for manufacturing an ink-jet print head according to claim 1 wherein said debondable SOI wafer has a bonding energy lower than 1,000 mJ/m$^2$.

9. The process for manufacturing an ink-jet print head according to claim 1 wherein said protective layer is made by an inorganic material selected from the group consisting of silicon oxide, silicon carbide and silicon nitride.

10. The process for manufacturing an ink-jet print head according to claim 1 wherein said protective layer has a thickness in the range of from 50 to 5,000 nm.

11. The process for manufacturing an ink-jet print head according to claim 1 wherein said protective layer has a thickness in the range of from 100 to 1,000 nm.

12. The process for manufacturing an ink-jet print head according to claim 1 wherein said step c) further comprises, after formation of said protective layer, the step of patterning said protective layer to leave a protective layer pattern above said first plurality of openings made in said barrier layer above said plurality of actuators and interconnections.

13. The process for manufacturing an ink-jet print head according to claim 1 wherein said bonding step d) is made by thermocompressing said device layer and said barrier layer under a pressure of from 3 to 10 bar, at a temperature of from 150° to 250° C., and for a period of time from 40 to 120 minutes.

14. The process for manufacturing an ink-jet print head according to claim 1 wherein said bonding step d) is carried out in vacuum environment.

15. The process for manufacturing an ink-jet print head according to claim 1 wherein said debonding step e) is carried out by mechanical opening using a single-blade or a multi-blade system.

* * * * *